(12) United States Patent
Hillman, Jr. et al.

(10) Patent No.: US 8,180,586 B2
(45) Date of Patent: *May 15, 2012

(54) AMPLITUDE DISCRIMINATION USING THE FREQUENCY MASK TRIGGER

(75) Inventors: Alfred K. Hillman, Jr., Banks, OR (US); Thomas C. Hill, III, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 503 days.

This patent is subject to a terminal disclaimer.

(21) Appl. No.: 12/369,660

(22) Filed: Feb. 11, 2009

(65) Prior Publication Data

US 2010/0204938 A1 Aug. 12, 2010

(51) Int. Cl.
G06F 19/00 (2011.01)

(52) U.S. Cl. .......................... 702/76; 702/124

(58) Field of Classification Search .................. 702/75, 702/76, 77, 19, 81, 111, 118, 120–122, 124, 702/126, 176, 178, 182–183, 193; 327/58, 327/307; 340/539.26; 342/70; 324/76.21, 324/76.22; 345/158
See application file for complete search history.

(56) References Cited

U.S. PATENT DOCUMENTS

| | | | |
|---|---|---|---|
| 4,870,348 A | 9/1989 | Smith et al. | |
| 5,103,402 A | 4/1992 | Morton et al. | |
| 5,381,150 A | 1/1995 | Hawkins et al. | |
| 7,251,577 B2 * | 7/2007 | Bernard et al. | 702/124 |
| 2006/0015277 A1 | 1/2006 | Bernard et al. | |
| 2006/0025947 A1 | 2/2006 | Earls | |
| 2007/0174021 A1 * | 7/2007 | Bernard et al. | 702/182 |
| 2007/0282542 A1 | 12/2007 | Duff et al. | |
| 2010/0204937 A1 * | 8/2010 | Harwood | 702/66 |
| 2010/0204939 A1 * | 8/2010 | Hillman et al. | 702/76 |

OTHER PUBLICATIONS

U.S. Appl. No. 12/369,669, filed Feb. 11, 2009, "Power Trigger With Time Qualified and Sequential Event Capability", Inventor: Steven L.Harwood, Assignee: Tektronix, Inc.
U.S. Appl. No. 12/369,673, filed Feb. 11, 2009, "Time Qualified Frequency Mask Trigger", Inventors: Alfred K. Hillman, Jr., et al., Assignee: Tektronix, Inc.
Non-Final Rejection in U.S. Appl. No. 12/369,669 dated Jun. 28, 2011.
Non-Final Rejection in U.S. Appl. No. 12/369,673 dated Jun. 24, 2011.
Anonymous: "Fundamentals of Real-Time Spectrum Analysis", 2008, pp. 1-52, XP002668787, Retrieved from the Internet: URL: http://www.tektronix-resources.com/0803pulsedrf/fundamentals spectrumanalysis.pdf—[retrieved on Feb. 1, 2012].

* cited by examiner

*Primary Examiner* — John H Le
(74) *Attorney, Agent, or Firm* — Michael A. Nelson

(57) ABSTRACT

A frequency mask trigger having frequency selective amplitude discrimination capability is provided for triggering when selected frequency components of an input signal fail to reach a desired power level. A frame of digital data representing an input signal is transformed into a frequency spectrum having at least one frequency bin, each frequency bin having a power amplitude value. Each power amplitude value is compared to an upper lower reference power levels and a lower reference power level. A trigger signal is generated when the power amplitude value in any frequency bin is above the lower reference power level and below the upper reference power level for a specified time duration.

12 Claims, 2 Drawing Sheets

AMPLITUDE DISCRIMINATION USING THE FREQUENCY MASK TRIGGER

FIELD OF THE INVENTION

The present invention relates to test and measurement instruments, and more particularly to triggers for use in the frequency domain.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These instruments capture seamless blocks of data so that, unlike conventional frequency swept spectrum analyzers, no data is missed or lost.

These instruments have the capability to trigger on events which occur in the frequency domain. This capability, known as a "frequency mask trigger," is described in U.S. Pat. No. 5,103,402. The frequency mask trigger calculates the frequency spectrum of real-time data provided by the instrument's receiver system and then compares the frequency spectrum to a user-defined frequency mask. When the frequency spectrum violates the frequency mask, a trigger signal is generated which causes a seamless block of data representing the received RF signal to be stored containing the triggering event as well what happened immediately before and immediately after the triggering event. In this manner the frequency mask trigger waits for a single specific spectral event to occur.

SUMMARY OF THE INVENTION

In some instances a user may want to trigger when selected frequency components of an RF signal are present but fail to reach a desired power level. The conventional frequency mask trigger cannot detect this condition because it has no capability to qualify the trigger signal based on the amplitude range of the signal. That is, it cannot distinguish an RF signal which is present but too low in amplitude from one which is not present at all.

What is desired is a frequency mask trigger having frequency selective amplitude discrimination capability.

Accordingly, embodiments of the present invention provide a frequency mask trigger having frequency selective amplitude discrimination capability for triggering when selected frequency components of an input signal fail to reach a desired power level. A frame of digital data representing an input signal is transformed into a frequency spectrum having at least one frequency bin, with each frequency bin having a power amplitude value. Each power amplitude value is compared to an upper reference power level and a lower reference power level. A trigger signal is generated when the power amplitude value in any frequency bin is above the lower reference power level and below the upper reference power level for a specified time duration.

The objects, advantages and other novel features of the present invention are apparent from the following detailed description when read in conjunction with the appended claims and attached drawings.

DETAILED DESCRIPTION OF THE INVENTION

Figure 1:
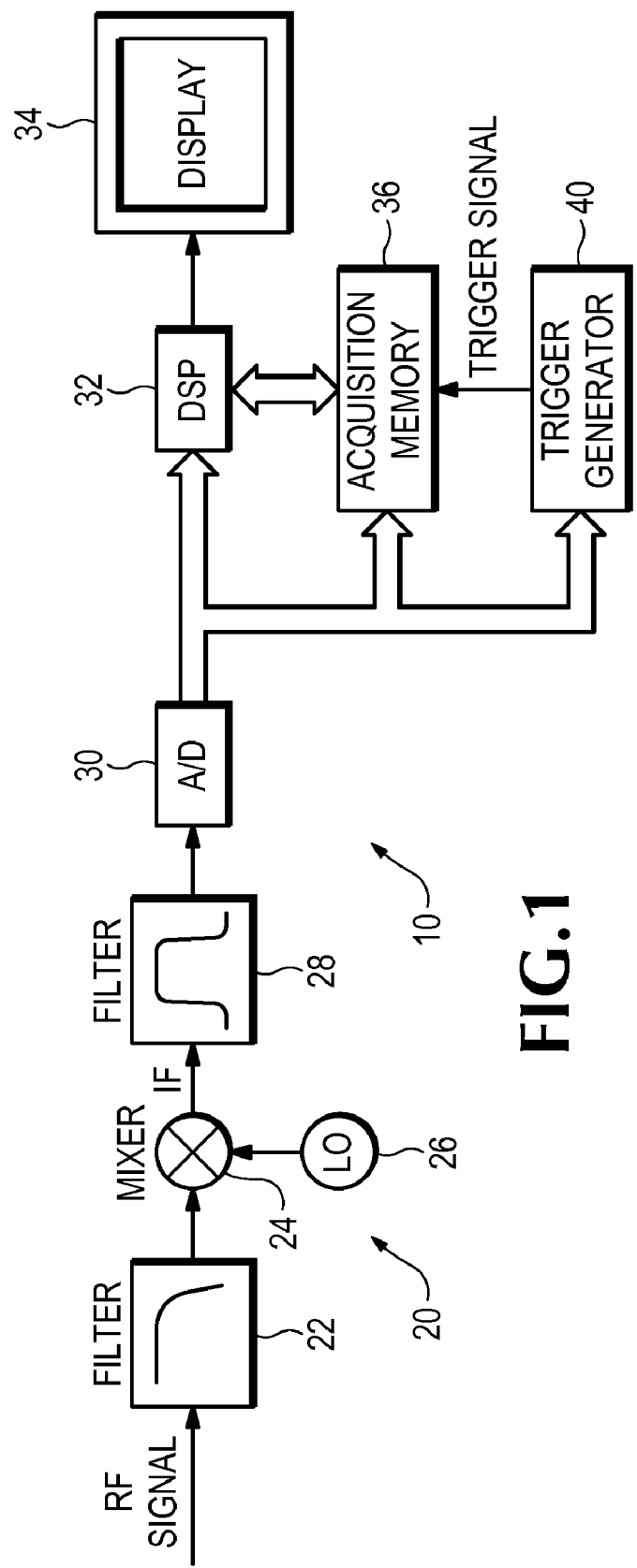
FIG. 1 illustrates a simplified, high-level block diagram of a real-time spectrum analyzer.

Referring now to FIG. 1, a real-time spectrum analyzer 10 is shown having an input processor 20 for receiving a radio frequency (RF) input signal. The input processor 20 includes an optional image reject filter 22 followed by a mixer 24 that converts the filtered input signal to an intermediate frequency (IF) signal using a local oscillator (LO) 26. The image reject filter 22 may be implemented using a lowpass filter, a bandpass filter, or a highpass filter. The IF signal is passed through a bandpass filter 28 and then input to an analog-to-digital (A/D) converter 30 to provide a digital signal for further processing. The digital signal is input to a digital signal processor (DSP) 32 for real-time processing for display on a monitor 34, such as in the form of a spectrogram as described in U.S. Pat. No. 4,870,348. The digital signal also is input to an acquisition memory 36 and to a trigger generator 40. In some embodiments, the acquisition memory 36 may be implemented using a circular memory. When the trigger generator 40 detects a trigger event, a trigger signal is generated that causes the acquisition memory 36 to store a seamless block of digital data from the digital signal for subsequent processing by the DSP 32 or for offloading to another processor (not shown) for non-real-time post-processing.

Figure 2:
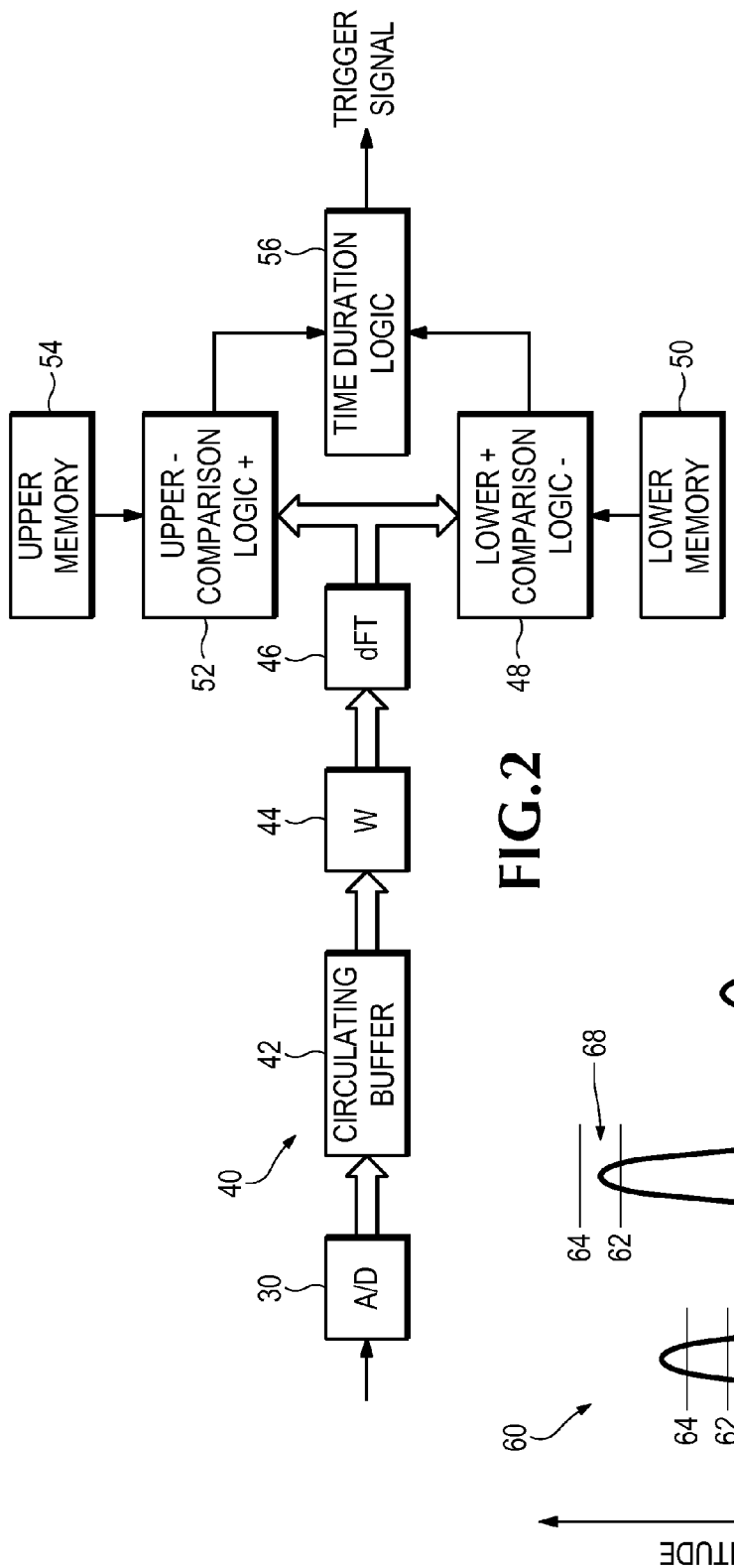
FIG. 2 illustrates a simplified, high-level block diagram of a trigger generator according to an embodiment of the present invention.

Referring now to FIG. 2, a trigger generator 40 according to an embodiment of the present invention having frequency selective amplitude discrimination capability is shown having a circulating buffer 42 for storing digital data representing the digital signal. In one embodiment, circulating buffer 42 may be implemented as a part of acquisition memory 36. In another embodiment, circulating buffer 42 may be implemented as a separate memory. A frame of digital data is read from circulating buffer 42 and windowed by a windowing function 44 such as a Blackman-Harris window. The windowed frame is converted to the frequency domain using a discrete Fourier transform (dFT) 46 to produce a frequency spectrum having at least one frequency bin, with each frequency bin having a power amplitude value. Each power amplitude value is input to a lower amplitude mask comparison logic 48 for comparison with an associated lower reference power level stored in a lower amplitude mask memory 50, and also input to an upper amplitude mask comparison logic 52 for comparison with an associated upper reference power level stored in an upper amplitude mask memory 54. The output of the lower amplitude mask comparison logic 48 and the output of the upper amplitude mask comparison logic 52 are input to time duration logic 56.

Figure 3:
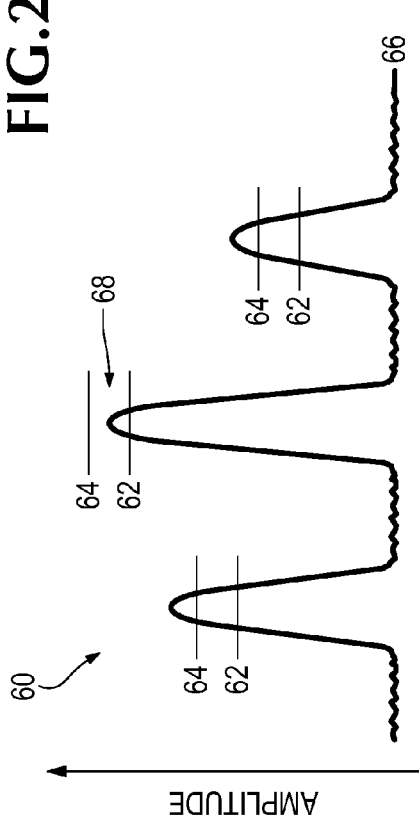
FIG. 3 depicts a user-defined frequency mask applied to a signal spectrum according to an embodiment of the present invention.

Referring now to FIG. 3, the lower reference power levels 62 and upper reference power levels 64 specified for each frequency bin define a frequency mask 60. In operation, the frequency selective amplitude discrimination function is accomplished by looking for the case where any power amplitude value of the frequency spectrum 66 exceeds the associated lower reference power level but does not exceed the associated upper reference power level as shown at location 68, that is, the output of lower amplitude mask comparison logic 48 is "true" and the output of upper amplitude mask comparison logic 52 is "false." If a power amplitude value exceeds the associated lower reference power level and does not exceed the associated upper reference power level in one frame of digital data, and then exceeds the upper reference power level in the very next frame of digital data, then the power amplitude value did not truly fail to achieve the upper reference power level, it simply had not done so during the first frame of digital data. The same condition would be found if the power amplitude value had been above the lower reference power level in one frame of digital data and then below the lower reference power level in the subsequent frame of digital data. In order to avoid false triggers in such cases, time duration logic 56 only generates the trigger signal when the logic condition is present for a specified number of frames of digital data, expressed as a time duration. If the condition exists for at least the specified time duration, the trigger signal is generated. If the condition does not exist for the specified time duration, the trigger signal is not generated.

In an alternative embodiment of the present invention, the trigger signal may be generated when any power amplitude value of the frequency spectrum 66 is not between the associated lower reference power level and the associated upper reference power level. In another alternative embodiment, the trigger signal may be generated if a logic condition exists for less than the specified time duration.

In various embodiments, the upper and lower reference power levels and time duration may be specified by the user or by a standard.

In order to provide real-time triggering, the trigger generation processing must be fast enough to keep up with the digital signal stream.

The embodiment described above uses a discrete Fourier transform to convert a time domain signal into a frequency spectrum. Alternatively, other transforms may be used such as a Hartley transform or a chirp-Z transform. Additionally, non-transform-based techniques may be used such as a bank of parallel filters, including finite impulse response filters and continuous-time analog filters.

Although the present invention has application to spectrum analyzers in particular, any test and measurement instrument which acquires data in response to a trigger signal may use the frequency mask trigger having frequency selective amplitude discrimination capability.

It will be appreciated from the foregoing that the present invention represents a significant advance in the field of frequency domain triggering. A frequency mask trigger having frequency selective and time qualified amplitude discrimination capability may detect many useful trigger conditions. Although a specific embodiment of the invention has been illustrated and described for purposes of illustration, it will be understood that various modifications may be made without departing from the spirit and scope of the invention. Accordingly, the invention should not be limited except as by the appended claims.

What is claimed is:

1. An instrument comprising:
   an input processor for receiving an input signal and producing a digital signal;
   a trigger signal generator for generating a trigger signal on the occurrence of a trigger event; and
   an acquisition memory for storing a seamless block of digital data from the digital signal in response to the trigger signal;
   the trigger signal generator comprising:
   a time-to-frequency converter for converting a frame of digital data from the digital signal into a frequency spectrum having at least one frequency bin, each frequency bin having a power amplitude value; and
   circuitry for generating the trigger signal when any power amplitude value exceeds an associated lower reference power level and does not exceed an associated upper reference power level for a specified time duration.

2. The instrument as recited in claim 1 wherein the input processor comprises:
   a mixer for mixing the input signal with a local oscillator signal to produce an intermediate frequency signal;
   a bandpass filter for filtering the intermediate frequency signal to produce a filtered intermediate frequency signal; and
   an analog-to-digital converter for digitizing the filtered intermediate frequency signal to produce the digital signal.

3. The instrument as recited in claim 2 wherein the input processor further comprises an image reject filter for filtering the input signal.

4. The instrument as recited in claim 1 wherein the trigger signal generator further comprises a windowing function for windowing the frame of digital data.

5. The instrument as recited in claim 1 wherein the time-to-frequency converter comprises a time-to-frequency transform selected from the group consisting of a discrete Fourier transform, a discrete Hartley transform, and a chirp-Z transform.

6. The instrument as recited in claim 1 wherein the time-to-frequency converter comprises a bank of parallel filters selected from the group consisting of finite impulse response filters and continuous time analog filters.

7. A method of acquiring data within a test and measurement instrument comprising the steps of:
   receiving an input signal and producing a digital signal;
   generating a trigger signal on the occurrence of a trigger event; and
   storing a seamless block of digital data from the digital signal in response to the trigger signal;
   the generating step comprising the steps of:
   converting a frame of digital data from the digital signal into a frequency spectrum having at least one frequency bins, each frequency bin having a power amplitude value; and
   generating the trigger signal when any power amplitude value exceeds an associated lower reference power level and does not exceed an associated upper reference power level for a specified time duration.

8. The method as recited in claim 7 wherein the receiving step comprises:
   mixing the input signal with a local oscillator signal to produce an intermediate frequency signal;
   bandpass filtering the intermediate frequency signal to produce a filtered intermediate frequency signal; and
   digitizing the filtered intermediate frequency signal to produce the digital signal.

9. The method as recited in claim 8 wherein the receiving step further comprises the step of filtering the input signal with an image reject filter.

10. The method as recited in claim 7 wherein the generating step further comprises the step of windowing the frame of digital data with a windowing function.

11. The method as recited in claim 7 wherein the converting step uses a time-to-frequency transform selected from the group consisting of a discrete Fourier transform, a discrete Hartley transform, and a chirp-Z transform.

12. The method as recited in claim 7 wherein the converting step uses a bank of parallel filters selected from the group consisting of finite impulse response filters and continuous time analog filters.

* * * * *